(12) United States Patent
Kanakasabai et al.

(10) Patent No.: US 9,586,496 B2
(45) Date of Patent: Mar. 7, 2017

(54) MODULAR STACKED DC ARCHITECTURE TRACTION SYSTEM AND METHOD OF MAKING SAME

(71) Applicant: General Electric Company, Schenectady, NY (US)

(72) Inventors: Viswanathan Kanakasabai, Bangalore (IN); Bhaskar Sen, Sheffield (IN)

(73) Assignee: GENERAL ELECTRIC COMPANY, Schenectady, NY (US)

(*) Notice: Subject to any disclaimer, the term of this patent is extended or adjusted under 35 U.S.C. 154(b) by 76 days.

(21) Appl. No.: 14/589,195

(22) Filed: Jan. 5, 2015

(65) Prior Publication Data

US 2015/0108925 A1 Apr. 23, 2015

Related U.S. Application Data

(63) Continuation of application No. 13/307,191, filed on Nov. 30, 2011, now Pat. No. 8,928,259.

(51) Int. Cl.
*H02P 3/14* (2006.01)
*B60L 11/18* (2006.01)
*H02P 27/14* (2006.01)
*B60L 11/00* (2006.01)
*B60L 15/00* (2006.01)
*H05K 13/00* (2006.01)

(52) U.S. Cl.
CPC ......... *B60L 11/1853* (2013.01); *B60L 11/005* (2013.01); *B60L 11/1866* (2013.01); *B60L 11/1868* (2013.01); *B60L 15/007* (2013.01); *H02P 27/14* (2013.01); *H05K 13/0023* (2013.01); *Y02T 10/644* (2013.01); *Y02T 10/645* (2013.01); *Y02T 10/7005* (2013.01); *Y02T 10/7022* (2013.01); *Y02T 10/7061* (2013.01); *Y02T 10/7066* (2013.01); *Y10T 29/49117* (2015.01); *Y10T 307/582* (2015.04); *Y10T 307/707* (2015.04)

(58) Field of Classification Search
CPC ... H02M 7/493; H02M 3/33584; H02P 29/00; H02P 3/14; Y10S 903/906; B62D 11/183; B62D 5/0463; B62D 5/0481; B62M 1/36; B62M 6/45; B62M 6/90; H01M 8/04
USPC .......................................................... 307/6
See application file for complete search history.

(56) References Cited

U.S. PATENT DOCUMENTS

| | | |
|---|---|---|
| 5,341,280 A | 8/1994 | Divan et al. |
| 5,710,699 A | 1/1998 | King et al. |
| 5,903,449 A | 5/1999 | Garrigan et al. |

(Continued)

*Primary Examiner* — Eduardo Colon Santana
*Assistant Examiner* — Bickey Dhakal
(74) *Attorney, Agent, or Firm* — Meagher Emanuel Laks Goldberg & Liao, LLP

(57) ABSTRACT

A modular stacked DC architecture for traction system includes a propulsion system includes an electric drive, a direct current (DC) link electrically coupled to the electric drive, and a first DC-DC converter coupled to the DC link. A first energy storage device (ESD) is electrically coupled to the first DC-DC converter, and a second DC-DC converter is coupled to the DC link and to the first DC-DC converter. The system also includes a second energy storage device electrically coupled to the second DC-DC converter and a controller coupled to the first and second DC-DC converters and configured to control a transfer of energy between the first ESD and the DC link via the first and second DC-DC converters.

20 Claims, 7 Drawing Sheets

(56) References Cited

U.S. PATENT DOCUMENTS

| | | |
|---|---|---|
| 7,568,537 B2 | 8/2009 | King |
| 7,595,597 B2 | 9/2009 | King et al. |
| 7,859,202 B2 * | 12/2010 | Lukic .................... B60L 11/005 180/65.21 |
| 8,292,009 B2 | 10/2012 | Yamada et al. |
| 2006/0152085 A1 | 7/2006 | Flett et al. |
| 2009/0314558 A1 * | 12/2009 | Ang .................... H02P 23/0004 180/65.1 |
| 2010/0133901 A1 | 6/2010 | Zhang et al. |

\* cited by examiner

MODULAR STACKED DC ARCHITECTURE TRACTION SYSTEM AND METHOD OF MAKING SAME

CROSS-REFERENCE TO RELATED APPLICATION

The present application is a continuation of and claims priority to U.S. patent application Ser. No. 13/307,191 filed Nov. 30, 2011, the disclosure of which is incorporated herein in its entirety.

BACKGROUND OF THE INVENTION

Embodiments of the invention relate generally to hybrid and electric vehicles and, more particularly, to a modular stacked direct current (DC) architecture traction system for hybrid and electric vehicles.

A hybrid electric vehicle (HEV) may combine an internal combustion engine and an electric motor powered by an energy storage device, such as a traction battery, to propel the vehicle. Typically, the electric motor of an HEV is coupled between the internal combustion engine and the transmission to take advantage of the torque increase through the transmission. Such a combination may increase overall fuel efficiency by enabling the combustion engine and the electric motor to each operate in respective ranges of increased efficiency. Electric motors, for example, may be efficient at accelerating from a standing start, while combustion engines may be efficient during sustained periods of constant engine operation, such as in highway driving. Having an electric motor to boost initial acceleration allows combustion engines in HEVs to be smaller and more fuel efficient.

A purely electric vehicle (EV) typically uses stored electrical energy to power an electric motor, which propels the vehicle. EVs may use one or more sources of stored electrical energy and are configured to use energy from an external source to re-charge the fraction battery or other storage devices. For example, a first source of stored energy (sometimes referred to as an "energy" source) may be used to provide longer-lasting energy while a second source of stored energy (sometimes referred to as a "power" source) may be used to provide higher-power for, for example, acceleration from standstill or boost during operation. First and second sources may include chemical-based batteries or may include ultracapacitors, as examples. Typically, the source(s) of electrical energy (energy and/or power batteries) in EVs are charged via a plug-in charger or other external energy source. With typically complete reliance on plug-in power, an EV may have increased energy storage capacity as compared to an HEV.

A plug-in hybrid vehicle (PHEVs) may include both an internal combustion engine and an electric motor powered by an energy storage device, such as a traction battery. Typically a PHEV is configured to use energy from an external source to re-charge the traction battery or other storage devices. Thus, with increased reliance on plug-in power, a PHEV may have increased energy storage capacity as compared to an HEV.

There are generally two types of PHEV: parallel and series. In a parallel PHEV arrangement, the electric motor is coupled between the internal combustion engine and the transmission, enabling the combustion engine and the electric motor to each operate in respective ranges of increased efficiency, similar to an HEV. In a series PHEV arrangement, the electric motor is coupled between an energy storage device and the vehicle drive axle, while the internal combustion engine is coupled directly to the energy storage device and not to the vehicle drive axle. The series PHEV may also be referred to as an extended range electric vehicle (EREV), in reference to a purely electric drive system having energy augmentation to the energy storage system via the internal combustion engine and via, for instance, a liquid fuel storage system.

In general, EVs, HEVs, and PHEVs typically include regenerative braking to charge the charge storage devices during braking operations. Also, such vehicles may include on-road and off-road vehicles, golf cars, neighborhood electric vehicles, forklifts, and utility trucks as examples. These vehicles may use either off-board stationary battery chargers or on-board battery chargers to transfer electrical energy from a utility grid or renewable energy source to the vehicle's on-board traction battery.

While hybrid and electric vehicles offer many advantages, managing the stored energy efficiently and maintaining a good capacity of the energy storage (ES) elements over a defined period are important considerations when sizing these ES elements. A high voltage ES element having several cells in series often experiences less-than-optimal cell voltage balancing. Degradation of a single cell in a string of series cells affects the capacity of the entire string. Due to this reason, a low voltage ES with several parallel strings and low number of series strings is often preferred.

In contrast to the low voltage preferred on the ES, the EV motor typically meets the torque and efficiency requirements when operated at high voltages. Often, DC-DC boost converters are used to couple low voltage ES to the high voltage DC link from which the drive of the motor is operated. These DC-DC converters typically employ expensive high voltage switches that are rated for the DC link voltage.

It would therefore be desirable to provide an apparatus for coupling the low voltage ES to the high voltage DC link using less-expensive, low voltage switches.

BRIEF DESCRIPTION OF THE INVENTION

In accordance with one aspect of the invention, a propulsion system includes an electric drive, a direct current (DC) link electrically coupled to the electric drive, and a first DC-DC converter coupled to the DC link. A first energy storage device (ESD) is electrically coupled to the first DC-DC converter, and a second DC-DC converter is coupled to the DC link and to the first DC-DC converter. The system also includes a second energy storage device electrically coupled to the second DC-DC converter and a controller coupled to the first and second DC-DC converters and configured to control a transfer of energy between the first ESD and the DC link via the first and second DC-DC converters.

In accordance with another aspect of the invention, a method of assembling a control system includes coupling a first energy storage device (ESD) to a first DC-DC converter, coupling the first DC-DC converter to a DC link, and coupling a second ESD to a second DC-DC converter. The method also includes coupling the second DC-DC converter to the first DC-DC converter and to the DC link, coupling the DC link to an electric drive, coupling a controller to the first and second DC-DC converters, and configuring the controller to cause the first and second DC-DC converters to transfer energy between the first ESD and the DC link.

In accordance with another aspect of the invention, an energy storage arrangement for an electrically powered system includes a first energy storage device coupled to a first DC-DC converter, a second energy storage device coupled to a second DC-DC converter, and a DC link. The DC link includes a first bus coupled to the first DC-DC converter and a second bus coupled to the second DC-DC converter. The arrangement further includes a controller coupled to the first and second DC-DC converters and configured to cause a current to flow from the second bus to the first bus through the first energy storage device and through the first and second DC-DC converters.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Figure 1:
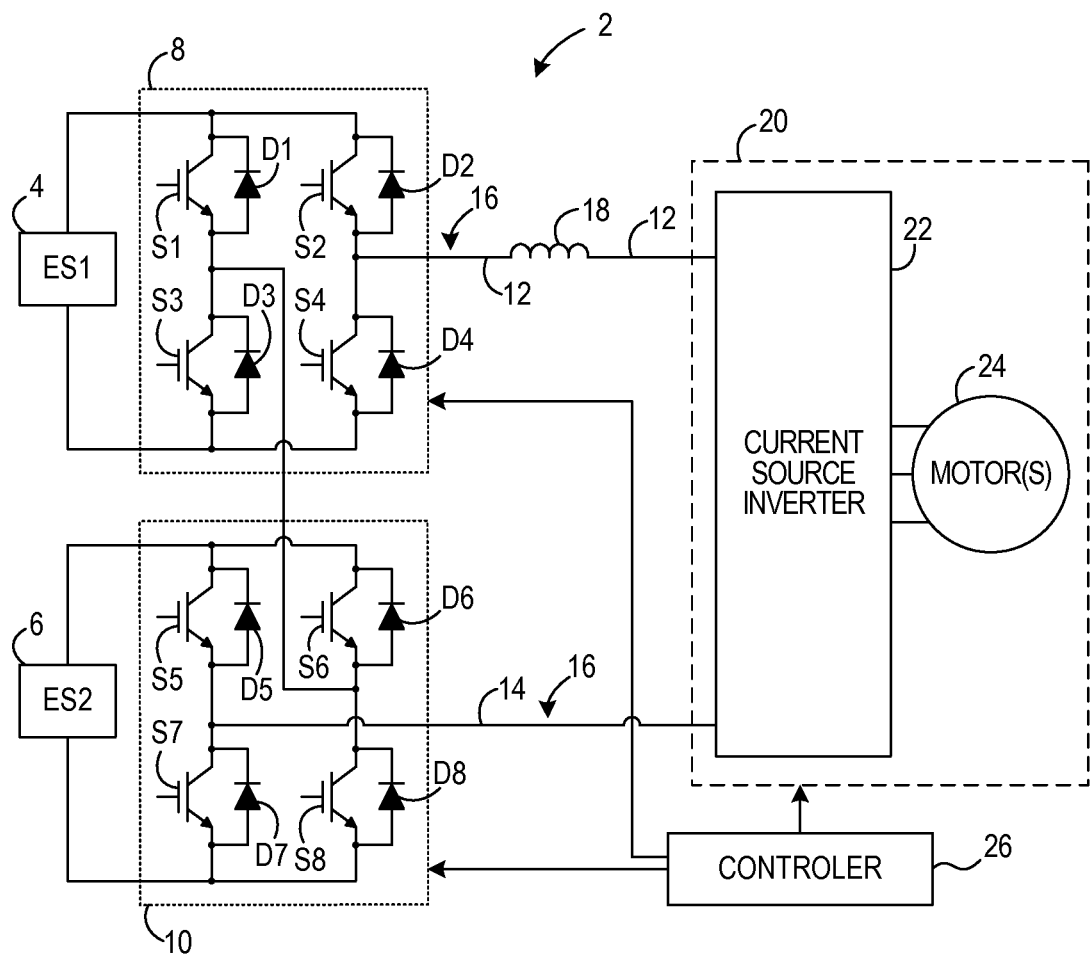
FIG. 1 is a schematic diagram of a fraction system in accordance with an embodiment of the invention.

FIG. 1 illustrates a modular stacked DC architecture traction/propulsion system 2 in accordance with an embodiment of the invention. Traction system 2 includes a first energy storage device (ES1) 4 and a second energy storage device (ES2) 6. In embodiments of the invention, ES1 4 and ES2 6 are low voltage, high specific-energy storage devices, and each may be, for example, an ultracapacitor or an energy battery. In this case, an ultracapacitor represents a capacitor comprising multiple capacitor cells coupled to one another, where the capacitor cells may each have a capacitance that is greater than 500 Farads. The term energy battery used in the embodiments shown herein describes a high specific-energy battery or high energy density battery demonstrated to achieve an energy density on the order of 100 W-hr/kg or greater (e.g., a Li-ion, sodium-metal halide, sodium nickel chloride, sodium-sulfur, zinc-air, nickel metal halide, or lead acid battery, or the like).

ES1 4 and ES2 6 are coupled to respective bi-directional DC-to-DC converters 8, 10 that, in one embodiment, are configured in an H-bridge configuration. Converter 8 includes a plurality of power switches S1-S4 coupled in an anti-parallel arrangement with a plurality of diodes D1-D4. Likewise, converter 10 includes a plurality of power switches S5-S8 coupled in an anti-parallel arrangement with a plurality of diodes D5-D8. Power switches S1-S8 may be, for example, bipolar junction transistors (BJTs) as shown, metal-oxide-semiconductor field-effect transistors (MOSFETs), insulated gate bipolar transistors (IGBTs), silicon-controlled rectifiers (SCRs), contactors, or other power switches known in the art. Converters 8, 10 are coupled to respective first and second buses 12, 14 of a DC current link 16, and an inductor 18 is additionally coupled to first bus 12.

As shown in FIG. 1, DC current link 16 is coupled to a load 20, which, according to an embodiment of the invention, is an electric drive including an inverter 22 and a motor or electromechanical device 24. In this embodiment, inverter 22 is a current source inverter configured to convert a current on DC current link 16 to an energy suitable for driving motor 24. Motor 24 is preferably an AC motor but is not limited as such. While not shown, it is to be understood that each of a plurality of motors 24 may be coupled to a respective wheel or other load or that each motor 24 may be coupled to a differential for distributing rotational power to the wheels or other load.

A controller 26 is coupled to switches S1-S8 of converters 8, 10 and to load 20 to control the transfer of energy from either or both of ES1 4 and ES2 6 to load 20 during a motoring mode and to control the transfer of energy generated during regenerative braking event to either or both of ES1 4 and ES2 6 during a deceleration event. Additionally, controller 26 may be configured to control the transfer of energy from ES1 4 to ES2 6 or from ES2 6 to ES1 4.

Figure 2:
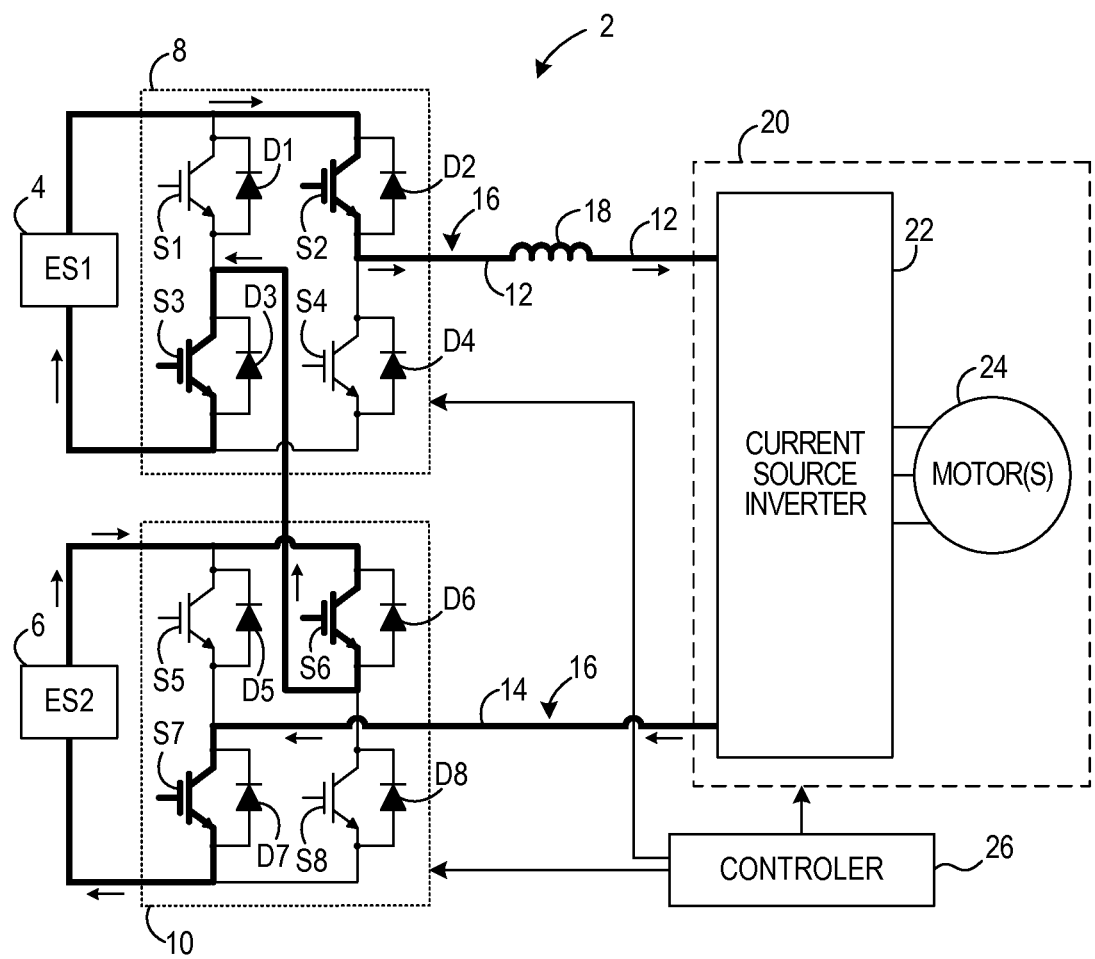
FIG. 2 is a schematic diagram of the traction system shown in FIG. 1 in a motoring mode in accordance with an embodiment of the invention.

FIG. 2 is a schematic diagram of the traction system shown in FIG. 1 in a motoring mode in accordance with an embodiment of the invention. In this embodiment, controller 26 controls the transfer of energy from one or both of ES1 4 and ES2 6 to load 20 for operating motor 24 in the motoring mode. As illustrated in bold, controller 26 allows the transfer of energy from both ES1 4 and ES2 6 to DC current link 16 by maintaining switches S1, S4, S5, and S8 in an off state and by controlling the duty cycle of switches S2, S3, S6, and S7. In this manner, current flowing from second bus 14 of DC current link 16 flows along a path through switch S7, ES2 6, switch S6, switch S3, ES1 4, and switch S2 and to first bus 12 of DC current link 16. The path of current from first bus 12 of DC current link 16 to second bus 14 of DC current link 16 flows through switch S10 of converter 28, through load 20, and through diode D11.

While the embodiment illustrated in FIG. 2 shows control of switches S2, S3, S6, and S7 of converters 8 and 10 to control the transfer of energy from both ES1 4 and ES2 6, by controlling the duty ratio of switches S2 and S6, controller 26 can also regulate the power to be drawn only from one of the energy storage elements, i.e. either from ES1 4 or from ES2 6. For example, by controlling duty ratio of switch S2 and turning off switch S6 completely, controller 26 can cause ES1 4 to provide power to DC current link 16 while bypassing ES2 6. By controlling switch S6 to its off state, current flowing through converter 10 flows through switch S7 and through diode D8 on its way to switch S3 of converter 8. Alternatively, by controlling switch S7 to its off state, current flowing through converter 10 flows through diode D5 and switch S6 on its way to switch S3 of converter 8. Likewise, by controlling switch S6 to its on state and switch S2 to its off state, controller 26 can cause ES2 6 to provide current to DC current link 16 while bypassing ES1 4.

In addition, by controlling switches S2 and S6 (with S3 and S7 ON) or switches S3 and S7 to their off states (with S2 and S6 ON), controller 26 can cause both ES1 4 and ES2 6 to stop supplying current to DC current link 16 when it is desired to halt operation in the motoring mode.

Figure 3:
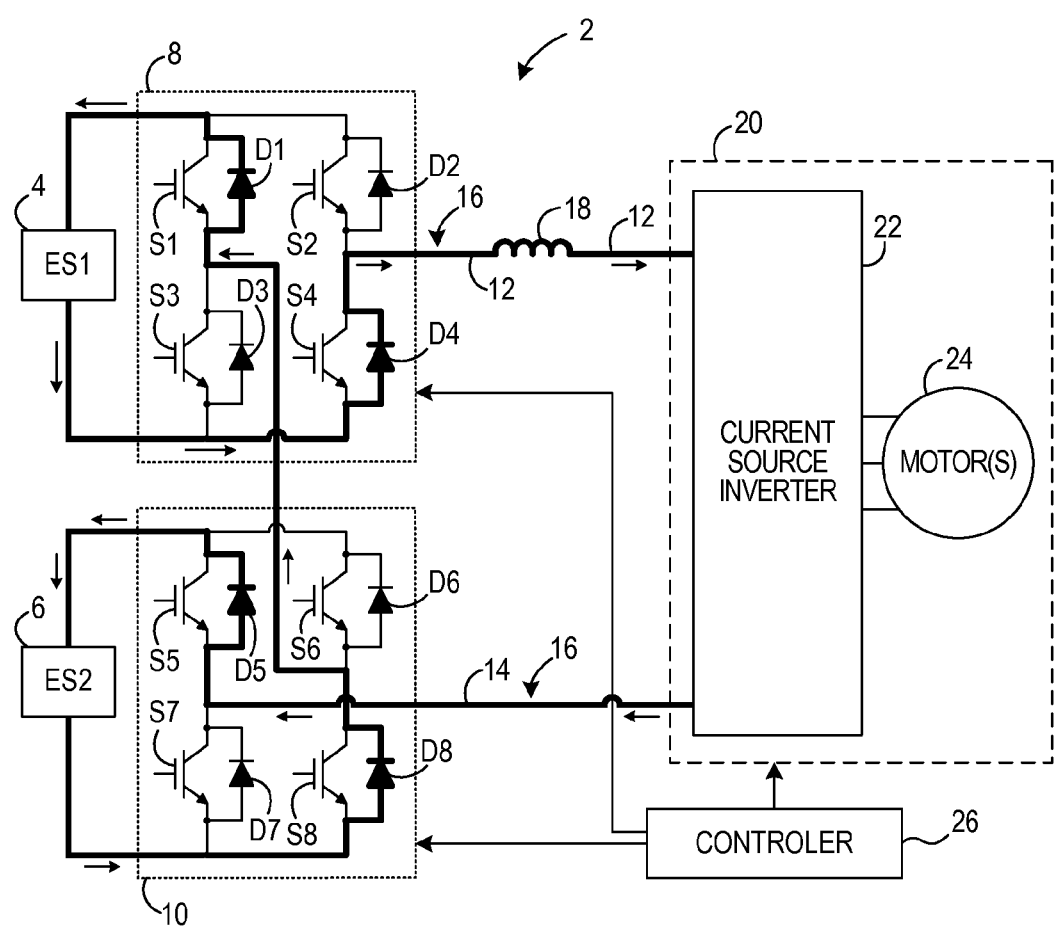
FIG. 3 is a schematic diagram of the traction system shown in FIG. 1 in a regenerative braking mode in accordance with an embodiment of the invention.

FIG. 3 illustrates a schematic diagram of the traction system shown in FIG. 1 operating in a regenerative braking mode in accordance with an embodiment of the invention. In this embodiment, controller 26 is shown controlling the transfer of energy from load 20 during a regenerative braking event to ES2 6. By maintaining all switches S1-S8 in their off states, current flows from second bus 14 through diode D5, ES2 6, diode D8, diode D1, ES1 4, and diode D4 to first bus 12. In this manner, ES1 4 and ES2 6 may both be recharged during the regenerative braking event.

However, by controlling either switch S2 or switch S6 to their on states, it is possible to respectively bypass ES1 4 or ES2 6 when it is desired to avoid recharging either ES1 4 or ES2 6.

While converters 8 and 10 are each shown in an H-bridge configuration having four switches and four diodes, embodiments of the invention contemplate removing one or more of the switches or diodes for cost and weight reduction savings benefits should it be determined that the switches or diodes to be removed will not have current flowing therethrough in any of the control modes programmed into controller 26 or in any other currents-flowing mode.

Figure 4:
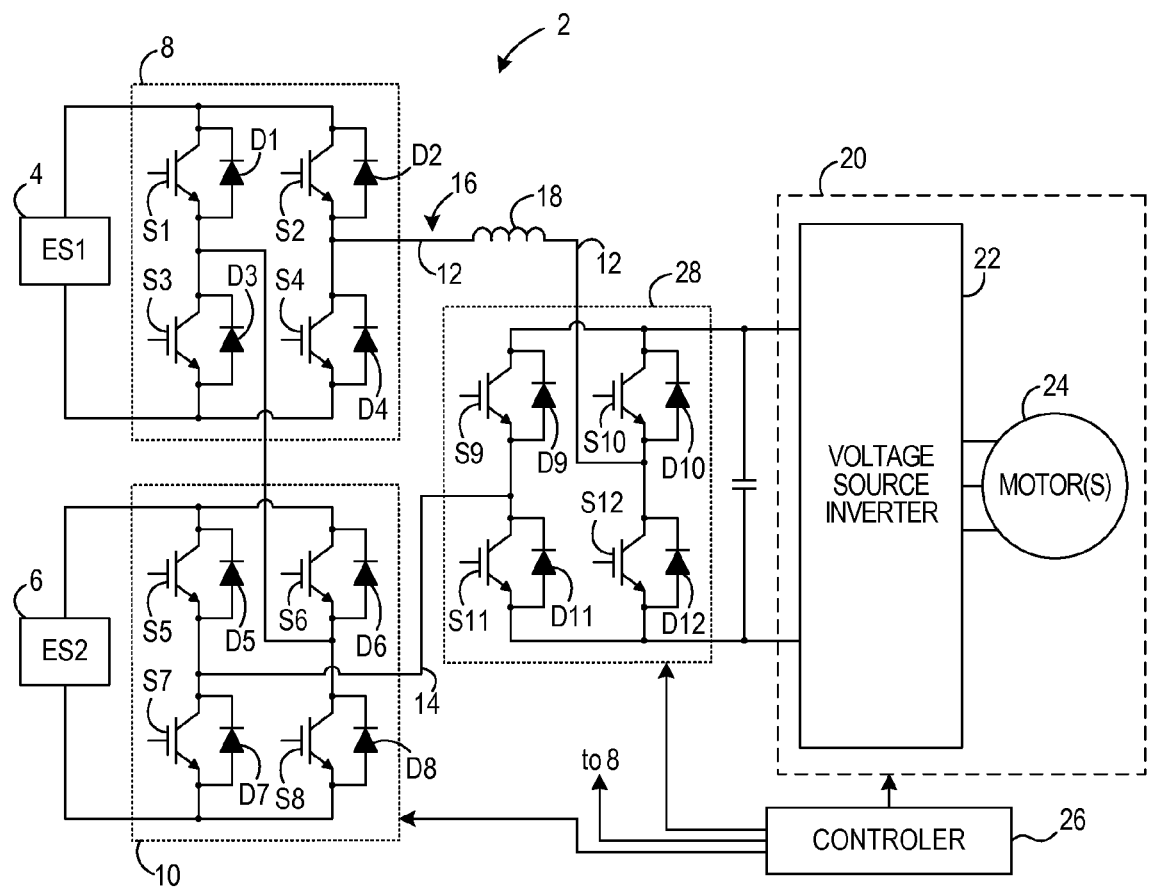
FIG. 4 is a schematic diagram of the traction system of FIG. 1 in accordance with another embodiment of the invention.

FIG. 4 illustrates another embodiment of modular stacked DC architecture traction/propulsion system 2. As shown, in addition to the components illustrated in FIG. 1, traction system 2 of FIG. 4 includes an additional bi-directional DC-to-DC converter 28 coupled between DC current link 16 and load 20. Similar to converters 8 and 10, converter 28 includes a plurality of power switches S9-S12 coupled in an anti-parallel arrangement with a plurality of diodes D9-D12. Controller 26 is additionally coupled to switches S9-S12 of converter 28 to control conversion of the current on DC current link 16 to a voltage that is supplied to load 20 and to control conversion of a voltage from load 20 to a current suitable for supplying to DC current link 16 for charging one or both of ES1 4 and ES2 6. In this embodiment, inverter 22 is a voltage source inverter configured to convert the voltage supplied thereto to an energy suitable for driving motor 24.

Figure 5:
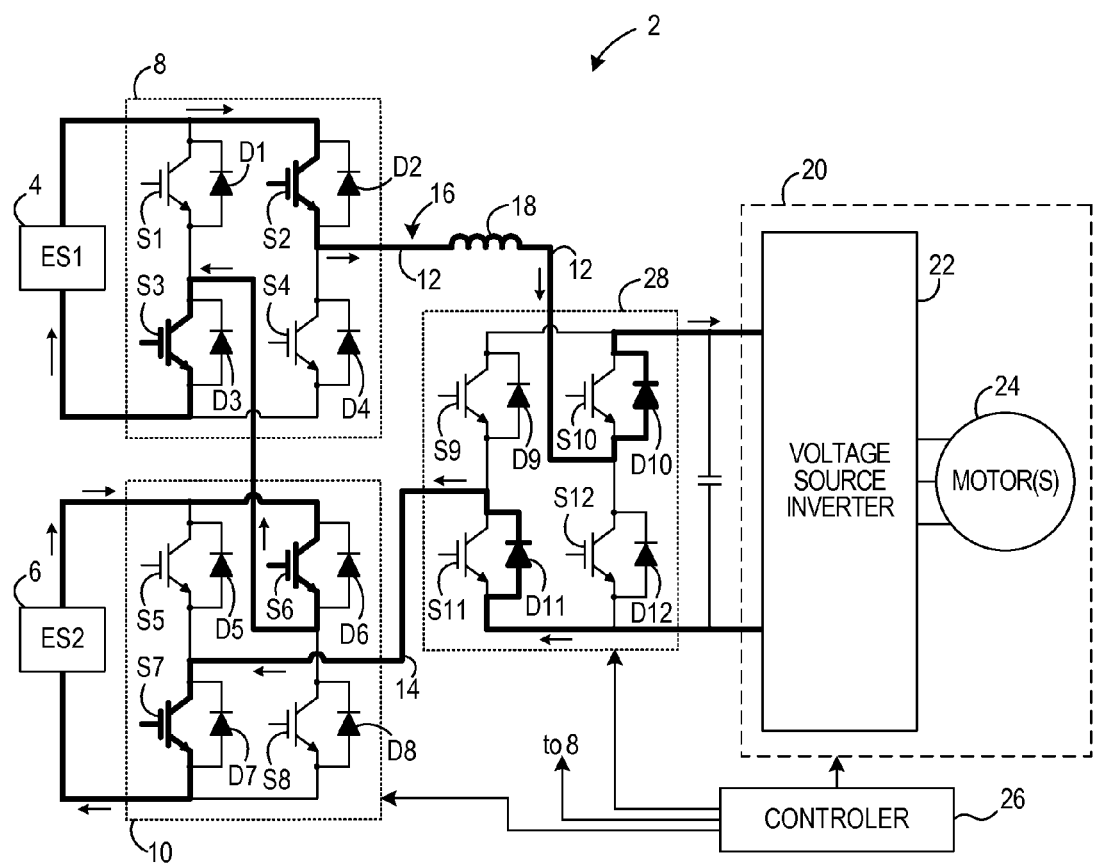
FIG. 5 is a schematic diagram of the traction system shown in FIG. 4 in a motoring mode in accordance with an embodiment of the invention.

FIG. 5 illustrates a schematic diagram of the traction system shown in FIG. 4 operating in a motoring mode in accordance with an embodiment of the invention. In this embodiment, controller 26 controls the transfer of energy from one or both of ES1 4 and ES2 6 to load 20 for operating motor 24 in the motoring mode. As illustrated in bold, controller 26 allows the transfer of energy from both ES1 4 and ES2 6 to DC current link 16 by maintaining switches S1, S4, S5, and S8 in an off state and by controlling the duty ratio of switches S2, S3, S6, and S7. In this manner, current flowing from second bus 14 of DC current link 16 flows along a path through switch S7, ES2 6, switch S6, switch S3, ES1 4, and switch S2 and to first bus 12 of DC current link 16. The voltage supplied to load 20 is regulated by controlling the duty ratio of switch S12. When S12 is on, the current from first bus 12 flows through switch S12 and diode D11 to second bus 14. When switch S12 is off, the current from first bus 12 flows through diode D10, load 20, and diode D11 to second bus 14.

While the embodiment illustrated in FIG. 5 shows control of switches S2, S3, S6, and S7 of converters 8 and 10 to control the transfer of energy from both ES1 4 and ES2 6, by controlling the duty ratio of switches S2 and S6, controller 26 can also regulate the power to be drawn only from one of the energy storage elements, i.e., either from ES1 4 or from ES2 6. For example, by controlling duty ratio of switch S2 and turning off switch S6 completely, controller 26 can cause ES1 4 to provide power to DC current link 16 while bypassing ES2 6. By controlling switch S6 to its off state, current flowing through converter 10 flows through switch S7 and through diode D8 on its way to switch S3 of converter 8. Alternatively, by controlling switch S7 to its off state, current flowing through converter 10 flows through diode D5 and switch S6 on its way to switch S3 of converter 8. Likewise, by controlling switch S6 to its on state and switch S2 to its off state, controller 26 can cause ES2 6 to provide current to DC current link 16 while bypassing ES1 4.

In addition, by controlling switches S2 and S6 (with S3 and S7 ON) or switches S3 and S7 to their off states (with S2 and S6 ON), controller 26 can cause both ES1 4 and ES2 6 to stop supplying current to DC current link 16 when it is desired to halt operation in the motoring mode.

Figure 6:
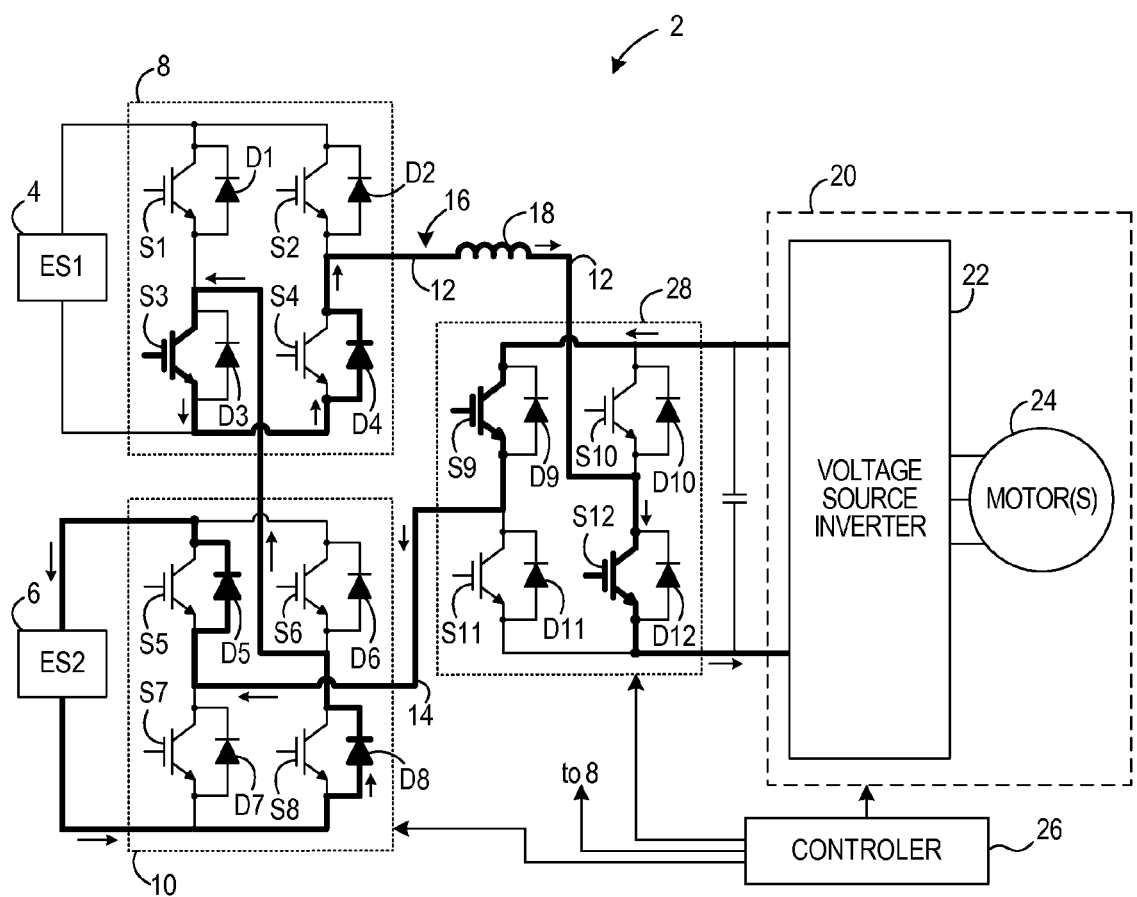
FIG. 6 is a schematic diagram of the traction system shown in FIG. 4 in a regenerative braking mode in accordance with an embodiment of the invention.

FIG. 6 illustrates a schematic diagram of the traction system shown in FIG. 4 operating in a regenerative braking mode in accordance with an embodiment of the invention. In this embodiment, controller 26 is shown controlling the transfer of energy from load 20 during a regenerative braking event to ES2 6. During the regenerative braking event, controller 26 controls motor 24 to operate in a generator mode to slow down or decelerate the vehicle, for example. In the generator mode, motor 24 generates energy that can be supplied to converter 28 through inverter 22. Energy from load 20 can be caused to flow into ES2 6 by controlling the duty ratio of switch S9 (or S12) with S12 (or S9) turned on completely. Accordingly, the current flowing from switch S9 flows through second bus 14 of DC current link 16 and through diode D5 to reach ES2 6. From there, the current flows through diode D8 and on to converter 8. By controlling switch S3 into its on state, the regenerative current bypasses diode D1 and ES1 4 on its path to first bus 12 of DC current link 16 through diode D4.

In another embodiment, by controlling switch S3 into its off state, controller 26 can cause the regenerative breaking current to flow through diode D1 to charge ES1 4 in addition to charging ES2 6. Further, by controlling switch S7 into its on state, the regenerative current may be forced to bypass ES2 6 on its way through diode D8 and on to converter 8.

Figure 7:
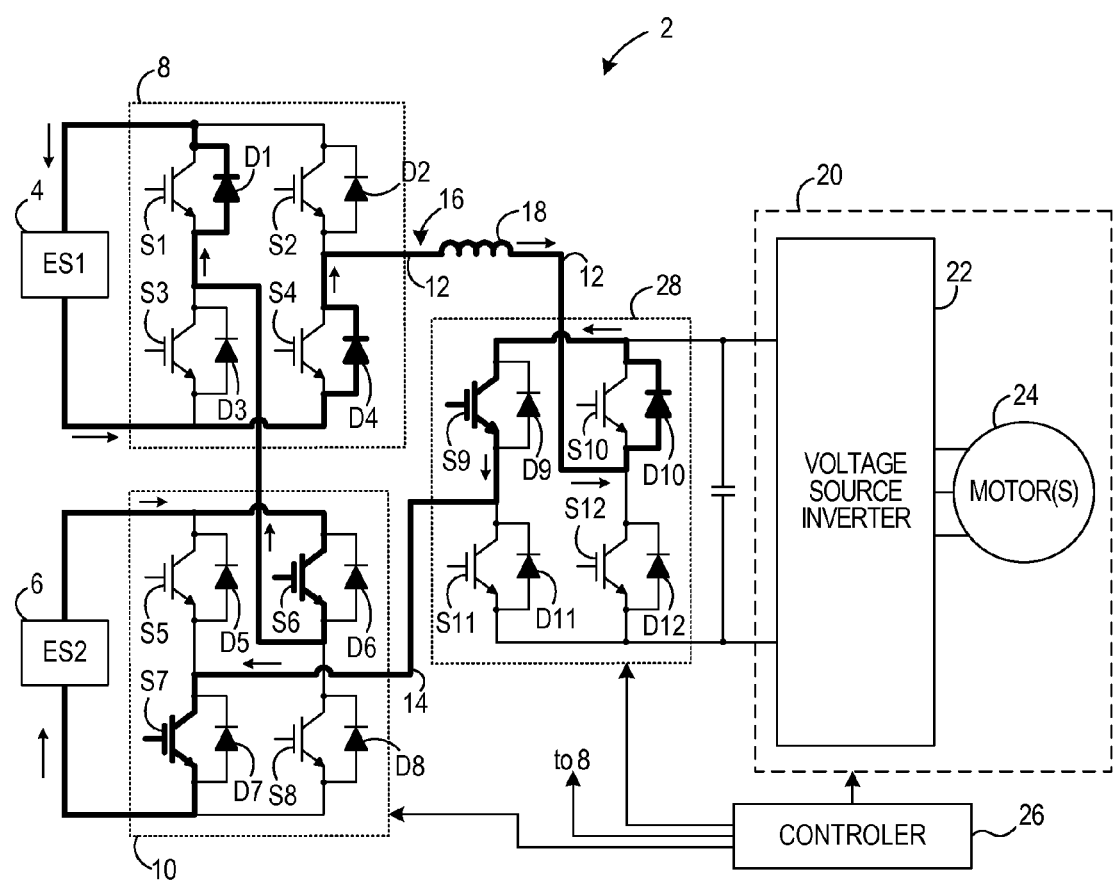
FIG. 7 is a schematic diagram of the fraction system shown in FIG. 4 in an energy transfer mode in accordance with an embodiment of the invention.

FIG. 7 illustrates a schematic diagram of the traction system shown in FIG. 4 operating in an energy transfer mode in accordance with an embodiment of the invention. In this embodiment, controller 26 is shown controlling the transfer of energy from ES2 6 to ES1 4 while bypassing the transfer of energy to load 20. As illustrated in bold, controller 26 allows the transfer of energy from ES2 6 to ES1 4 by maintaining switches S1-S5, S8, and S10-S12 in their off state; switches S9, S6 in their on state; and by controlling duty ratio of switch S7. In this manner, current flowing from ES2 6 flows along a path through switch S6 and diode D1 to reach ES1 4. From ES1 4, the current returns to ES2 6 via the path flowing through diode D4, first bus 12 of DC current link 16, diode, D10, and switches S9 and S7.

In addition, by controlling switch S9 to its off state and by controlling inverter 22, controller 26 may cause both an energy transfer from ES2 6 to ES1 4 in an energy transfer mode while simultaneously causing an energy transfer from ES2 6 to load 20 in a motoring mode. In this manner, if the state of charge of ES1 4 is reduced below a desired threshold level, ES2 6 may be used to begin or maintain motoring of the vehicle while simultaneously raising the state of charge of ES1 4 to a desired level.

In an embodiment where ES1 4 is configured to transfer its energy to ES2 6, the flow of current through ES1 4 and ES2 6 as depicted in FIG. 5 may be reversed for such a transfer by controlling switches S6 and S7 to their off states and switches S2 and S3 to their on states.

As illustrated in FIGS. 5-7, DC current link 16 is unidirectional. That is, the current in DC current link 16 flows from converter 8 to converter 28 and from converter 28 to converter 10 in all of the embodiments described above. Because of this, active control of some of the switches S1-S12 to their on states does not occur. For example, switches S1, S4, S5, S8, S10, and S11 are not switched to their on states to avoid the opposite flow of current in DC current link 16 in the embodiments described herein. As such, switches S1, S4, S5, S8, S10, and S11 may be removed to reduce circuitry for cost and weight reduction savings benefits if desired.

Therefore, according to one embodiment of the invention, a propulsion system includes an electric drive, a direct current (DC) link electrically coupled to the electric drive, and a first DC-DC converter coupled to the DC link. A first energy storage device (ESD) is electrically coupled to the first DC-DC converter, and a second DC-DC converter is coupled to the DC link and to the first DC-DC converter. The system also includes a second energy storage device electrically coupled to the second DC-DC converter and a controller coupled to the first and second DC-DC converters and configured to control a transfer of energy between the first ESD and the DC link via the first and second DC-DC converters.

According to another embodiment of the invention, a method of assembling a control system includes coupling a first energy storage device (ESD) to a first DC-DC converter, coupling the first DC-DC converter to a DC link, and coupling a second ESD to a second DC-DC converter. The method also includes coupling the second DC-DC converter to the first DC-DC converter and to the DC link, coupling the DC link to an electric drive, coupling a controller to the first and second DC-DC converters, and configuring the controller to cause the first and second DC-DC converters to transfer energy between the first ESD and the DC link.

According to another embodiment of the invention, an energy storage arrangement for an electrically powered system includes a first energy storage device coupled to a first DC-DC converter, a second energy storage device coupled to a second DC-DC converter, and a DC link. The DC link includes a first bus coupled to the first DC-DC converter and a second bus coupled to the second DC-DC converter. The arrangement further includes a controller coupled to the first and second DC-DC converters and configured to cause a current to flow from the second bus to the first bus through the first energy storage device and through the first and second DC-DC converters.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A propulsion system comprising:
an electric drive;
a direct current (DC) link comprising a first bus and a second bus coupled to the electric drive;
a first DC-DC converter directly coupled to the first bus of the DC link through a first connection;
a second DC-DC converter directly coupled to the second bus of the DC link through a second connection and directly coupled the first DC-DC converter through a third connection, independent of the first connection and second connection:
a first energy storage device (ESD) coupled to the first DC-DC converter; and
a second ESD coupled to the second DC-DC converter.

2. The propulsion system of claim 1 wherein the first DC-DC converter electrically connects the second ESD to the first bus of the DC link.

3. The propulsion system of claim 2 wherein the second DC-DC converter electrically connects the first ESD to the second bus of the DC link.

4. The propulsion system of claim 1 wherein the first DC-DC converter and the second DC-DC converter are bi-directional.

5. The propulsion system of claim 1 further comprising a third DC-DC converter coupled between the electric drive and the first and second DC-DC converters.

6. The propulsion system of claim 1 further comprising a controller electrically coupled to the first DC-DC converter and the second DC-DC converter to selectively control operation thereof.

7. The propulsion system of claim 1 wherein:
the first DC-DC converter comprises a first plurality of switches and a first plurality of diodes; and
the second DC-DC converter comprises a second plurality of switches and a second plurality of diodes.

8. The propulsion system of claim 7 wherein the controller is programmed to transfer energy from the first ESD and the second ESD to the electric drive by:
controlling a first subset of the first plurality of switches to operate in an off state;
controlling a second subset of the first plurality of switches to operate in an on state;
controlling a first subset of the second plurality of switches to operate in an off state; and
controlling a second subset of the second plurality of switches to operate in an on state.

9. The propulsion system of claim 7 wherein the controller is programmed to transfer energy from the electric drive to the first ESD and to the second ESD by:
controlling the first plurality of switches to operate in an off state; and
controlling the second plurality of switches to operate in an off state.

10. The propulsion system of claim 7 wherein the controller is programmed to transfer energy from the electric drive to only one of the first ESD and the second ESD by controlling only one switch of one of the first plurality of switches and the second plurality of switches to operate in an on state.

11. The propulsion system of claim 10 wherein the controller is programmed to transfer energy from the electric drive to the first ESD by controlling one of the first plurality of switches to operate in an on state.

12. The propulsion system of claim 10 wherein the controller is programmed to transfer energy from the electric drive to the second ESD by controlling one of the second plurality of switches to operate in an on state.

13. The propulsion system of claim 1 wherein:
the first DC-DC converter comprises a first plurality of switches and a first plurality of diodes; and
the second DC-DC converter comprises a second plurality of switches and a second plurality of diodes.

14. A method of manufacturing a propulsion system comprising:
- coupling an electric drive to a first bus and to a second bus of a DC link;
- directly coupling a first DC-DC converter to the first bus of the DC link through a first connection;
- directly coupling a second DC-DC converter to the first DC-DC converter through a second connection;
- directly coupling the second DC-DC converter to the second bus of the DC link through a third connection independent of the first connection and second connection;
- coupling a first energy storage device (ESD) to the first DC-DC converter; and
- coupling a second ESD to the second DC-DC converter.

15. The method of claim 14 further comprising electrically coupling a controller to the first and second DC-DC converters, the controller programmed to selectively control switching thereof.

16. The method of claim 14 further comprising coupling a third DC-DC converter between the electric drive and the first and second DC-DC converters.

17. A vehicle comprising:
- an electric drive comprising an inverter coupled to an electric motor; a direct current (DC) link comprising a first bus and a second bus coupled to the electric drive;
- a first DC-DC converter directly coupled to the first bus of the DC link through a first connection;
- a second DC-DC converter directly coupled to the second bus of the DC link through a second connection and directly coupled to the first DC-DC converter through a third connection, independent of the first connection and second;
- a first energy storage device (ESD) coupled to the first DC-DC converter; and
- a second ESD coupled to the second DC-DC converter.

18. The vehicle of claim 17 wherein the first DC-DC converter electrically connects the second ESD to the first bus of the DC link.

19. The vehicle of claim 17 wherein the second DC-DC converter electrically connects the first ESD to the second bus of the DC link.

20. The vehicle of claim 17 further comprising a controller electrically coupled to the first DC-DC converter and the second DC-DC converter to selectively control operation thereof.

* * * * *